United States Patent [19]

Agrawal

[11] Patent Number: 5,091,872
[45] Date of Patent: Feb. 25, 1992

[54] APPARATUS AND METHOD FOR PERFORMING SPIKE ANALYSIS IN A LOGIC SIMULATOR

[75] Inventor: Prathima Agrawal, New Providence, N.J.

[73] Assignee: AT&T Bell Laboratories, Murray Hill, N.J.

[21] Appl. No.: 370,934

[22] Filed: Jun. 23, 1989

[51] Int. Cl.⁵ .............................................. G06F 15/20
[52] U.S. Cl. ........................................ 364/578; 371/23
[58] Field of Search ................ 364/488, 489, 578, 200, 364/900; 371/23

[56] References Cited

U.S. PATENT DOCUMENTS

| | | | |
|---|---|---|---|
| 3,715,573 | 2/1973 | Vogelsberg | 371/23 |
| 4,306,286 | 12/1981 | Cocke et al. | 364/200 |
| 4,656,580 | 4/1987 | Hitchcock, Sr. et al. | 364/200 |
| 4,787,062 | 11/1988 | Nei et al. | 364/900 |
| 4,827,427 | 5/1989 | Hyduke | 364/578 X |
| 4,942,615 | 7/1990 | Hirose | 364/578 |

*Primary Examiner*—Parshotam S. Lall
*Assistant Examiner*—Edward R. Cosimano
*Attorney, Agent, or Firm*—J. W. Herndon; G. D. Green

[57] ABSTRACT

A logic circuit simulator for detecting a spike condition at the output of a simulated gate. A plurality of autonomous devices are arranged for parallel pipeline operation. Each device is designed to perform only a part of the overall simulation function. One of the devices is responsive to signals representing gate input stimuli and to gate propagation delay data primarily for performing the spike analysis function. Another device performs the function of gate output signal scheduling in response to gate input stimuli for transmitting messages containing said signals to the spike analyzing device and other devices of the simulator. When the spike analyzing device detects a spike condition, it transmits into the pipeline signals indicating the scheduling of an unknown output event on the gate in question.

10 Claims, 4 Drawing Sheets

EVENT CANCELLATION

PREV_CURR_TIME = 5
CURR_TIME = 8
PREV_SCH_TIME = 15
SCH_TIME = 12

EVENT CANCELLATION

PREV_CURR_TIME = 5
CURR_TIME = 8
PREV_SCH_TIME = 15
SCH_TIME = 12

TIMING CONFLICT DUE TO A SPIKE

PREV_CURR_TIME = 5
CURR_TIME = 11
PREV_SCH_TIME = 15
SCH_TIME = 19

APPARATUS AND METHOD FOR PERFORMING SPIKE ANALYSIS IN A LOGIC SIMULATOR

TECHNICAL FIELD

The invention pertains to the field of logic circuit simulation and especially to the problem of detecting and providing for spike generation at the output of simulated circuit devices resulting from closely-spaced input signal transitions.

BACKGROUND OF THE INVENTION

In logic circuit design, it is known that under certain conditions the outputs of logic devices will assume unknown states for short periods of time. For example, if a logic gate has output different rise and fall delays, then it is possible for the output to contain spikes, or glitches. This problem has been known for some time now in the logic circuit simulation art. It has been quite expensive in terms of run time overhead to provide spike analysis in logic simulators. In most cases, the problem is handled in one of two ways. One solution is to ignore the problem. In this case, the problem does not occur during simulation. This solution results in an overly optimistic simulation in which such spikes might occur in practice, but in which the designer has no indication during simulation and design of the potential problem. The other solution is to assume that fully developed output pulses develop at the output of a device in response to every impulse, irrespective of the duration of the input pulse. This solution is overly pessimistic. The two solutions are sometimes referred to as the pulse suppress and pulse pass modes of simulation, respectively.

As mentioned, the need and methods for performing spike analysis have been known in the logic simulation art for some time. U.S. Pat. No. 4,787,062 to Nei, et al discusses one solution in the context of a hardware simulator. In brief, the method used to perform spike analysis in the patent is as follows. If the spike analysis mode is in effect for a device when an input event is scheduled for the device, then an event queue is searched and if there are other events scheduled in an event queue for the device, an appropriate output register is forced to a state defined as UNKNOWN. However, as mentioned, the overhead in terms of simulation time to perform this analysis, can become quite large.

SUMMARY OF THE INVENTION

An improvement in the art is achieved in a logic circuit simulator arranged for detecting a spike condition at the output of a simulated gate without substantial additional overhead in terms of speed of performance. The simulator comprises a plurality of autonomous devices arranged for parallel operation, with each device being designed to perform only a part of the overall simulation function. One of the devices is responsive to signals representing gate input stimuli and to gate propagation delay data primarily for performing the spike analysis function.

In the preferred embodiment, a first device performs the function of gate output signal scheduling in response to gate input stimuli for transmitting messages containing said signals to the spike analyzing device and both the signal scheduling and spike analyzing devices are programmable processors programmed to perform their specified function of the overall simulation. Also in the preferred embodiment, the plural devices are arranged in a series connected pipeline. When the spike analyzing device detects a spike condition, it transmitting into the pipeline signals indicating the scheduling of an unknown output event on the gate in question.

To accomplish the above, both of the signal scheduling and the spike analyzing devices maintain separate time wheels. Each time wheel contains a plurality of time slots for storing scheduled times of occurrences of gate output events. In particular, the spike analyzing device stores in its time wheel scheduled unknown state output events that represent its detection of a spike condition at a gate output.

Spike conditions are determined by calculating the time between successive gate input signal transistions and comparing these results to stored data representing gate propagation delays. Data for both rise times and fall times are stored. The scheduled times of event occurrences are determined and spike analysis is performed by referring to the appropriate rise or fall delay depending on the gate output events in question. The level of sensitivity of spike analysis is controllable by a user. This is accomplished by allowing a user to specify a spike factor which is used to multiply nominal gate rise and fall delays to establish weighted rise and fall delays. The factor can vary between 0 and 1. This corresponds to a continuum of delay values representing user optimism or pessimism between the so-called pulse suppress (spike factor=1) and pulse pass (spike factor=0) mode of prior art systems that also perform spike analysis.

DETAILED DESCRIPTION

Figure 1:
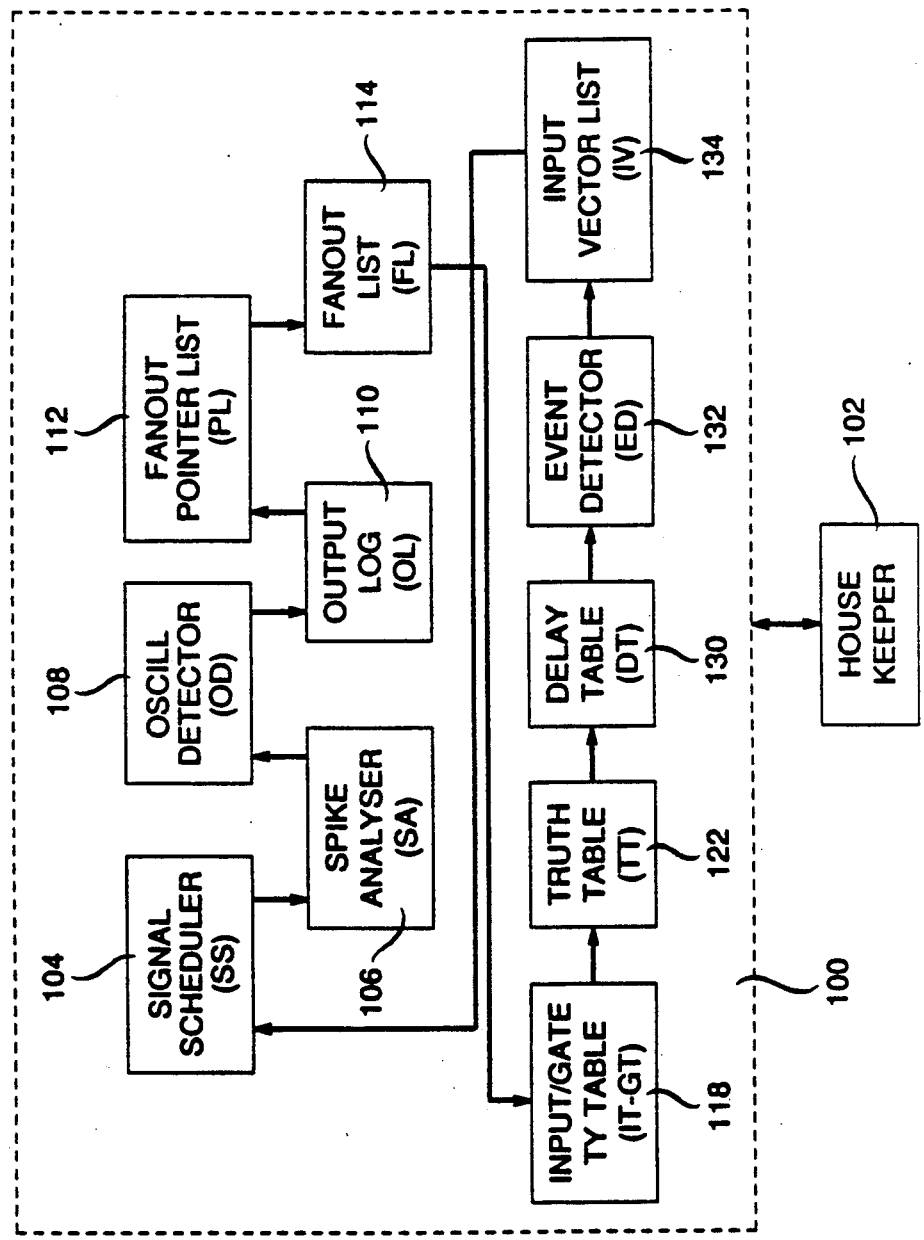
FIG. 1 shows an illustrative block diagram of the simulator, including a plurality of processors, one of which performs general signal scheduling and another performs spike analysis, connected in a pipeline and each being programmed to perform a specified part of the overall simulation function.

FIG. 1 shows the architecture of a hardware multiple delay logic simulator. Timing analysis algorithms for event scheduling, cancellation, spike and other modes of analysis are implemented on a set of reconfigurable processing elements, arranged in a pipeline configuration. This hardware consists of a cluster of processing elements (PEs) connected by a crossbar switch that can be reconfigured each clock cycle. The crossbar switch and other details of the configuration are described in a co-pending U.S. patent application Ser. No. 07/408,459, filed Sept. 15, 1989 entitled MICROPROGRAMMABLE HARDWARE ACCELERATOR, which is a continuation of U.S. patent application Ser. No.

06/066,921, filed June 25, 1987, now abandoned. The contents of this application in its entirety are incorporated herein by reference. Each PE is a 16-bit microprogrammed processor with special features for message passing, list and table manipulation, and bit field operations. Each PE has its own local memory. Communication between PEs is performed entirely by message passing.

Logic simulation is performed by partitioning the simulation algorithm over the PEs within the cluster. The partitioning is done to balance evenly the load among the PEs and to achieve performance characteristics and simulation accuracy heretofore not available. The local memories of the PEs contain the connectivity and other pertinent information of a circuit under simulation. The illustrative simulator has a circuit processing capacity of 65,536 4-input gates. It generates one of four values 0, 1, X and U for the output states of each device being simulated. X represents an unknown output state value, which includes the state for a spike condition. U represents the state of an unused pin on a simulated gate. U is also interpreted as high impedance states of devices, such as transmission gates and buses.

In FIG. 1, the housekeeper 102 interacts with the individual pipeline PEs to manage the simulation process. Housekeeper 102 may be implemented by any number of general purpose computers, microprocessors or workstations. In the specific embodiment, it is a SUN 3 Model 160 or 260 workstation. At the start of a simulation, housekeeper 102 loads the memories of each PE with circuit data and an appropriate microprogram for the particular function performed by the PE. The microcode describes the simulation algorithm, while the data represent the partitioned data structure of the circuit under simulation. The data structure consists of fanout pointers, fanout list, gate type, delay table, truth tables corresponding to the various logic primitives and an input table which describes the input states for each gate of the simulated circuit. In addition, housekeeper 102 specifies the total number of simulation time steps to be carried out to the signal scheduler PE (SS) 102 and the vector period to the output log (OL) stages of the pipeline. The vector period is a constant interval that reflects how often in a simulation a set of new external test inputs are applied to primary gate inputs of the simulated circuit. During simulation, the housekeeper 102 responds to interrupts from the PEs that indicate a full output buffer, an oscillating signal, or the end of simulation (an empty input buffer).

The SS PE 104 is a multiple delay scheduler incorporating a 4096-slot time-wheel. The SS 104 performs scheduling and cancellations of gate events it receives as a result of evaluation by other PEs of gate output transitions according to stored gate rise and fall times and gate input stimuli. It enters this information in linked lists of a gate record and points to the information by entering a pointer into the appropriate time slot of the time wheel. Event cancellations occur, as will be described below, when more than one future output event is scheduled to occur on a gate.

Spike analysis is accomplished in SA 106 by dynamically calculating the time between input signals and comparing the results with appropriate gate delay information. The oscillation detector (OD) PE 108 detects zero-delay oscillations by counting the number of times each signal has changed state during a present time slot and interrupts the housekeeper 102 when the count exceeds a preset value. An output log (OL) PE 110 records transitions at user specified output points of the simulated circuit. These transitions are recorded in a buffer as they are received. When this buffer is full, OL 110 interrupts the housekeeper to empty the buffer. Two buffer areas in its local memory are used to log signal transitions. These buffers are emptied by the housekeeper when so requested by the OL. The fanout list (FL) PE 114 contains a list of fanouts of each gate in the simulated circuit. The pointer list (PL) PE 112 contains pointers to each gate's fanout list in FL 114. The behavior of each gate is represented by data structures in the gate type (IT-GT) PE 118, truth table (TT) PE 122, and the delay table (DT) PE 130. The input vector (IV) PE 134 inserts test vectors, representing primary input signal changes, to the pipeline beginning at SS 104. Input vectors are stored in the IV 134 and are scheduled at the appropriate time slot in the time-wheel of SS 104. In addition, changes in outputs of gates due to gate fanout must also be scheduled in SS 104. For this purpose, event detector (ED) PE 132 detects changes in the output states of fanout gates and passes only those events that change the value of an output state to SS 104 via IV 134. ED 132 also forwards the appropriate rise or fall gate delays obtained from the DT 130 for these events. IV 134 adds these delays to the present time (obtained from SS 104) and forwards it to again to SS 104 for further processing.

In conventional event driven logic simulators, fanout update and evaluation phases are performed in two phases. In the present simulator, these phases are combined into a single phase. Gates are evaluated by ED 132 immediately after an input signal changes and a message representing the evaluation is put immediately into the pipeline. Thus, a gate may be evaluated several times in one time step if multiple inputs change at the same time. However, because the evaluation is done by a separate stage in the pipeline, evaluating a gate will not increase the time it takes for an event to be processed by the pipeline. Spurious events generated from multiple gate evaluations are canceled using the event cancellation algorithm described below.

Having briefly discussed the architecture of the simulator, we now proceed to a more detailed discussion of the related problems of event cancellation and spike analysis. In a multiple-delay simulator in which the simulated devices have separate rise and fall delays, it is possible for a new event to be scheduled at the output of a gate before a pending event is scheduled to occur. In such a case, the pending event must be canceled. Consider the example shown in FIG. 2. The AND gate 20 is assumed to have rise and fall delays of 10 and 4, respectively. At time 5 a rising input event is detected and a rising output event is therefore scheduled for time 15. Before this event can occur, a falling input event arrives at a time 8 and a falling output event is therefore scheduled at time 12. The event scheduled for time 15 must be canceled or it will leave the circuit in an incorrect steady state with B low and C high. For proper circuit simulation, all but the most recently scheduled pending events must be canceled. Now consider, for example, the circuit in FIG. 3. At time 5, a pulse of width 6 is applied to gate 40 on input B. Conventional event cancellation cancels the first output event scheduled to occur at 15 and filters the second scheduled for time 19, producing no output pulse. In reality, due to the interdependence of the inertial delay of gate 40 and the times at which the gate input transitions take place, the value of the gate output from time 15 to time 19 (the spike interval) cannot be determined and should be set to an unknown state (X).

To determine whether to schedule an X or not in the simulator, a spike factor, S, that ranges between 0 and 1, is introduced. A weighted delay, $T_d$, of a gate for rising or falling pulse edges is $T_d = T_r \times S$ or $T_d = T_f \times S$, respectively, where $T_r$ and $T_f$ is the rise and fall time, respectively, of the gate. An unknown state X is scheduled during the spike interval whenever an input signal separation interval is greater than $T_d$. Separation intervals narrower than $T_d$ are ignored. This spike factor allows the user to control the degree of optimism in the simulation. When S=1, the weighted delay equals the rise/fall delay and spikes are always ignored (as with event cancellation). This is similar to the pulse suppression simulation mode known in the prior art. When S=0, the weighted delay is zero and events are always scheduled. This is similar to the pulse pass simulation mode of known prior art.

Figure 4:
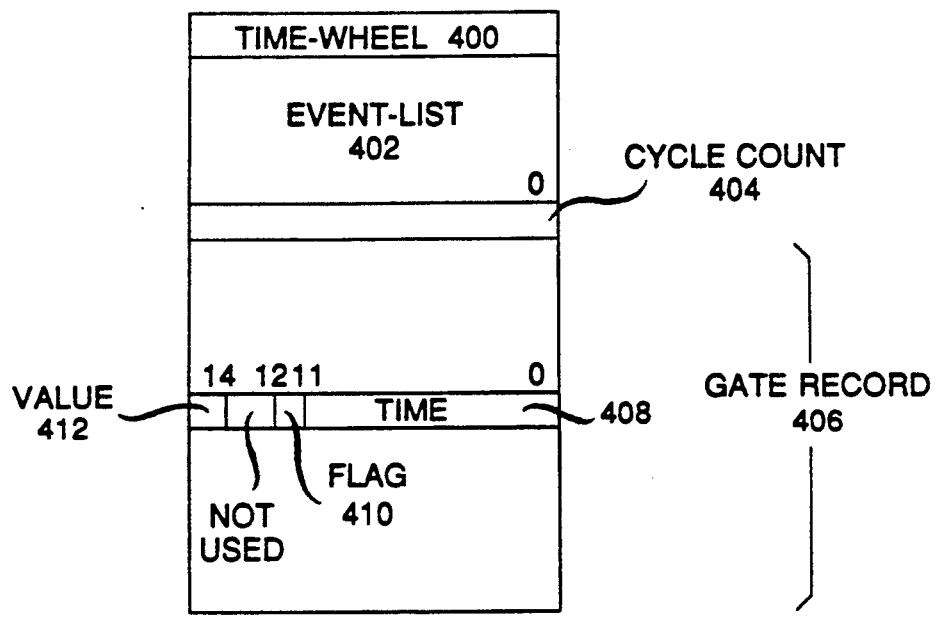
FIG. 4 shows an illustrative data structure of the signal scheduling processor, including a time wheel comprising a plurality of scheduling time slots.
Figure 5:
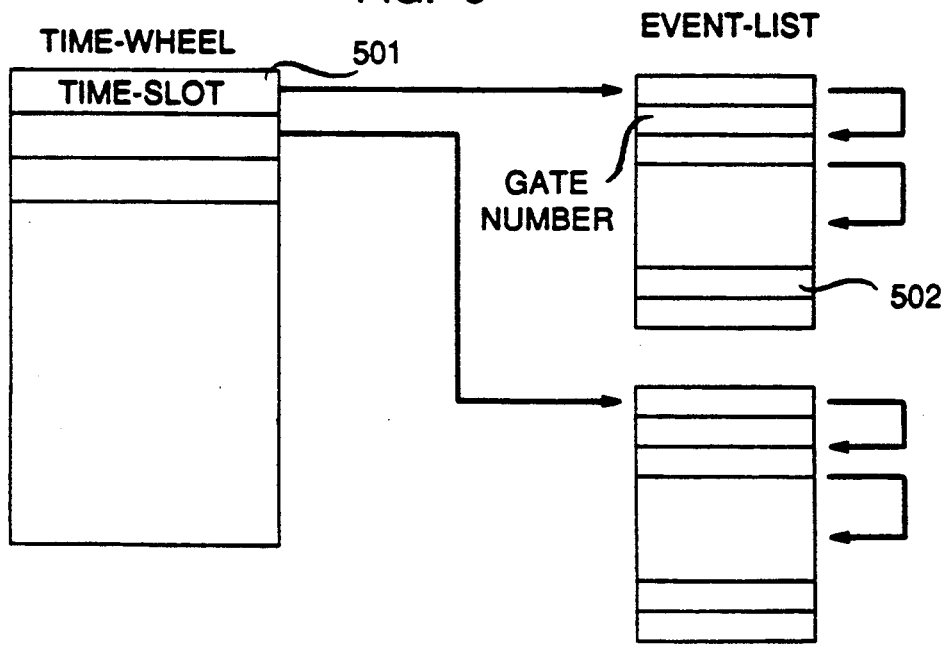
FIG. 5 shows more details of the data structure of FIG. 4.

The details of the operation of SS 104 and SA 106 are now discussed. The data structure of SS 104 is shown in FIG. 4. A time-wheel 400 contains 4,096 time slot entries. Each time slot entry of the time-wheel contains a pointer to the beginning of a linked list in the event list 402. This event list 402 is a linked list of the gate numbers on which an output event is scheduled during the time slot, as shown in FIG. 5. The cycle count 404 is loaded with a number from the housekeeper which specifies how many time steps for which the circuit is to be simulated. The gate record 406 is indexed by a gate number obtained from the event list 402 or from an incoming event message from IV 134. Each entry in the gate record specifies additional information about an event that is scheduled in the event list 402. A later-scheduled event overwrites an earlier-scheduled event. Thus, for the gate in question, a time entry 408 stores the time and value field 412 contains the resulting output state of the last-scheduled state transition. A flag 410 is described below. Referring now to FIG. 5, a pointer associated with each time slot, such as 501, points to a first address, such as 502, in a linked event list. A gate number is stored in each address in the event list. Thus, the numbers of all gates that will experience an event during a particular time slot are associated with that time slot.

Figure 2:
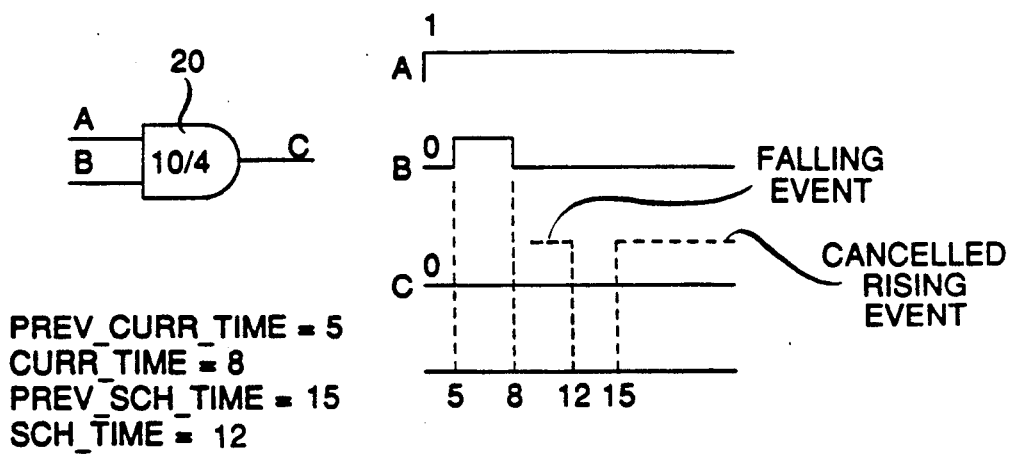
FIG. 2 shows a gate input pulse pattern that leads to event cancellation in the signal scheduling processor of FIG. 1.
Figure 3:
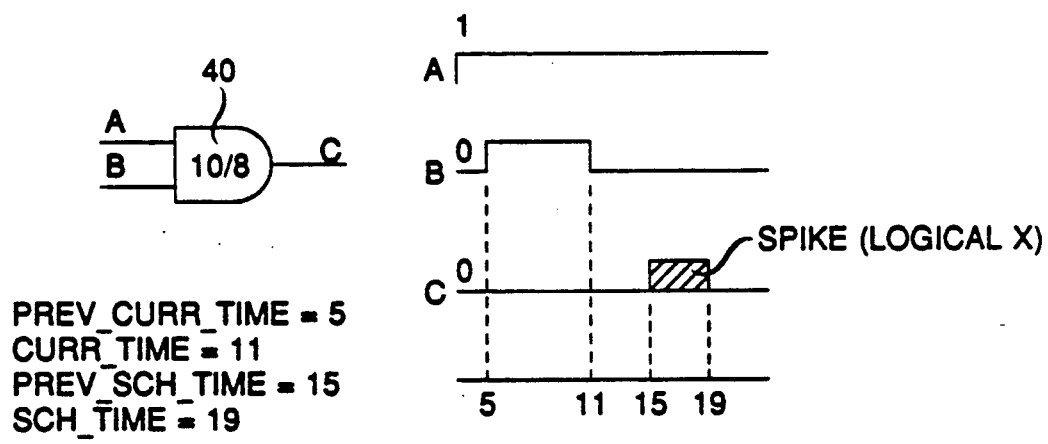
FIG. 3 shows a gate input pulse pattern that leads to detection of and scheduling of a spike condition by the spike analyzing processor of FIG. 1.
Figure 6:
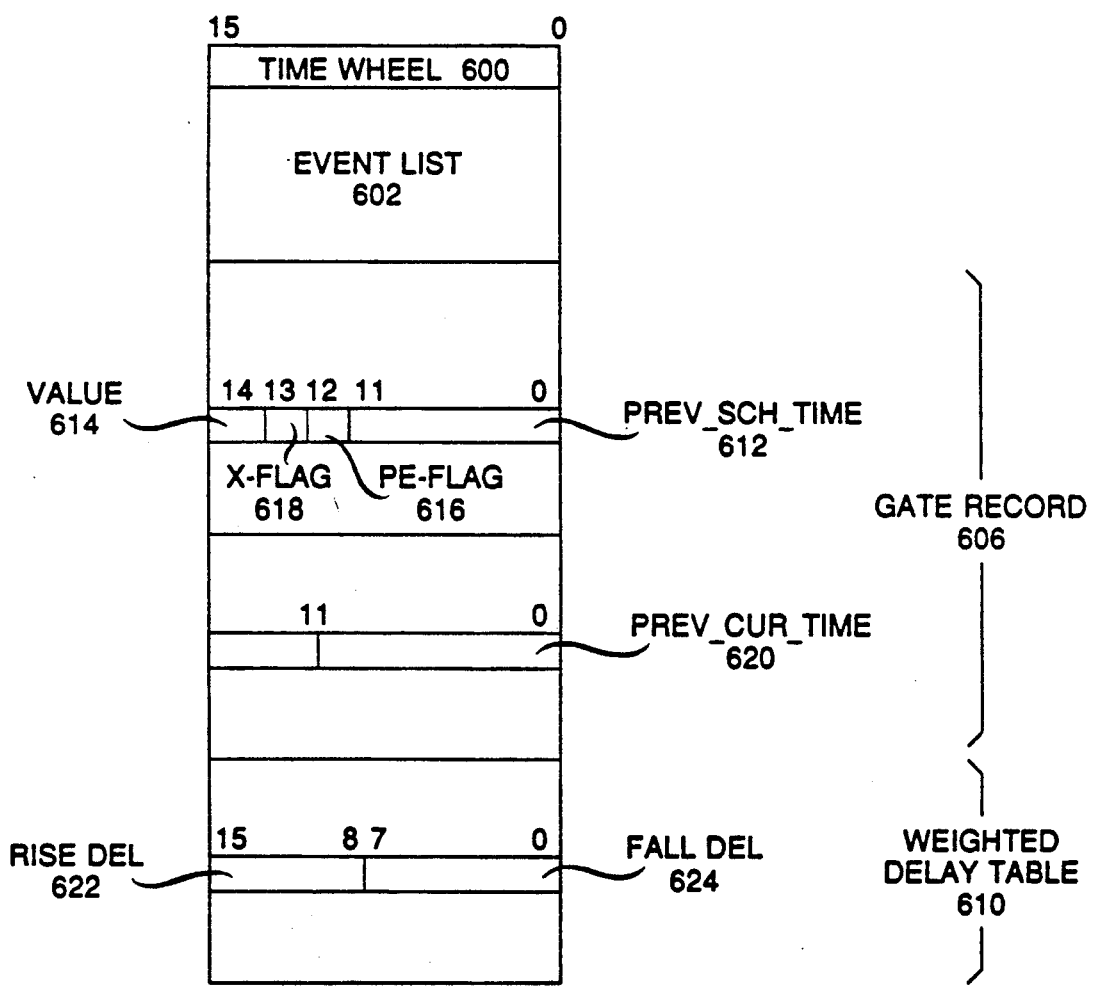
FIG. 6 shows an illustrative data structure of the spike analyzing processor of FIG. 1, including its time wheel for scheduling spike output events.

SA 106 has a data structure, shown in FIG. 6, which is similar to the data structure of SS 104. For example, it has a time-wheel 600 and event list 602 identical to that of SS 104. In addition, the data structure of SA 106 includes a weighted delay table 610 which includes the rise and fall times in respective fields 622 and 624 for the gates of the simulated circuit multiplied by the S factor discussed above. Each gate record contains a field PREV_CUR-TIME 620 that contains the time slot at which the last input change took place at the gate PREV_SCH_TIME field 612 that contains the time of the previously scheduled output event that contains the time slot at which the last input, a value field 614 and two flags PE_FLAG (616) and X_FLAG (618). The meanings of the fields CUR-TIME and PREV_SCH_TIME are shown in FIGS. 2 and 3. These fields, together with the PREV_CURR_TIME and SCH_TIME as shown in FIGS. 2 and 3 are used for measuring the width of an interval between successive input signals. The pending event flag PE_FLAG, indicates whether there is any pending event that has been scheduled on this gate. The X_FLAG indicates that a spike condition is scheduled for a gate. The time wheel 600 is the keeper of events that make a transition from 0 or 1 to the unknown value X whenever a spike condition has to be scheduled.

Basically, SS 104 and SA 106 operate as follows. First, while in a receive mode, SS 104 receives from IV 134 messages containing gate number, time at which a gate output event is to be scheduled and output state value for each event detected by ED 132 and each input test vector inserted into the pipeline by IV 134. SS 104 updates its event list 402 and gate record 406 and schedules an event in its time-wheel for every event that is received from IV 134 since the execution of its last receive mode. It also sends a message to SA 106, which is also in a receive mode, for every such new event so that SA 106 can update its data structure accordingly. While it is updating this information, SA 106 also performs a spike analysis if there is already a pending event on the gate. The spike analysis is performed separately and concurrently by SA 106 with the receive mode processing of SS 104. Next, SS 104 enters a transmit mode in which it forwards messages about events scheduled to occur in the present time slot. Before beginning this processing, it sends a message to SA 106 causing it also to enter a transmit mode. For presently scheduled entries, SS 104 either cancels spurious gate events in its gate record 402 or, if a presently scheduled event is a valid event, it transmits a corresponding routine event message to SA 106. When it enters the transmit mode, SA 106 first transmits messages forward to OD 108 specifying known spike conditions (X_state) for every event on its event list that is scheduled for the present time slot. It then merely forwards the routine messages received from SS 104 while SS 104 is processing its transmit mode to OD 108.

A more detailed description of the above operations of SS 104 and SA 106 is now made with reference to Appendices A and B. These Appendices contain pseudo code of the operations of SS 104 and SA 106. This pseudo-code is written using syntax similar to that of the well known C programming language. In this language, the operator ! means "not", !=means "not equal", && means "logical" and the operator | | stands for the logical OR operation. Appendix A is a listing of the pseudo code that controls the above summarized operations of SS 104. Appendix B shows the pseudo code for SA 106. In Appendix A, RECEIVE_event is executed by SS 104 when it is in its receive mode. In this mode, all new gate output events are processed. For each new event, the gate record is updated by setting flag 410 to "1", time 408 to the future scheduled time of the event and value 412 to the scheduled output state of the gate. Next, the event list 402 is updated. The scheduled time is used to select the correct time slot in time-wheel 400 and the link list associated with this time slot is updated with the gate number. Finally, a message including the gate number, current time, the future scheduled time in 408 and value 412 is sent to SA 106 for each new event.

RECEIVE_MODE in Appendix B is the portion of the SA 106 algorithm that processes messages received from SS 104 in receive mode. For each such message received from SS 104, SA 106 retrieves information from its gate record, including the previous current time PREV_CUR_TIME (see FIG. 2), the previous scheduled time PREV_SCH_TIME and the PE_FLAG. Next, the gate record is updated to store the present scheduled time and current time as the new entries PREV_SCH_TIME and PREV_CUR_

TIME. The PE_FLAG associated with the gate in question is checked. If PE_FLAG is not set, meaning that there are no presently scheduled events for this gate, the PE_FLAG is set and the next message, if any is processed. If the PE_FLAG is set when the message is received and no spike condition has already been detected (!X_FLAG) and the contents of SCH_TIME is greater than the contents of PREV_SCH_TIME, then spike analysis, is performed. First, the input signal interval is determined by subtracting from the present time (CUR_TIME) at which an input transition has occurred the previous time (PREV_CURR_TIME) at which an earlier transition occurred. If the input signal interval is less than the weighted delay from either 622 or 624, no spike condition is present and the event is ignored. Otherwise, an unknown output state (X) is scheduled by entering an X_event in the time wheel 600 at the previous scheduled time obtained from the gate record. The weighted delay that is used depends upon the direction of transition of the output pulse. If the transition is from "0" to "1" or "0" to "X", the weighted rise delay in field 622 is used. Otherwise, the weighted fall delay in field 624 is used. The X_FLAG is used to handle multiple transitions at a gate. This flag indicates whether an X_event has already been scheduled. If so, nothing further is done by SA 106. The effect is merely to stretch the duration of the X state.

When SS 104 completes its receive mode, it executes its transmit mode to cancel spurious events in the event_list 402 for the present time slot or to pass event information on to SA 106 for the present time slot. This is shown as TRANSMIT_event in Appendix A. For each entry in the gate record 406 scheduled for the present time slot, either an event message is transmitted to SA 106 or the event is cancelled if the present time is not equal to the scheduled time stored in 408. This can happen if an event previously entered into the event list, is overwritten by a subsequent event. Thus, an event message is transmitted if and only if the present time is the same as the time in the field SCH_TIME of a gate record and the one-bit flag 410 is set. This flag means that there is a valid pending event which has yet to be transmitted forward. The flag 410 is reset upon transmitting a valid event. Its use prevents the transmission of multiple redundant messages which can occur due to simultaneous input changes at the gate.

TRANSMIT_to_OD is the portion of the SA 106 algorithm that transmits messages to OD 108 after completion of its receive mode. In this transmitting mode, initially SA 106 receives the present time from the SS 104. All pending X events resulting from spike analysis in the SA time wheel 600 are first transmitted to the OD 108. Next, SA 106 transmits all routine event messages received from the SS 104 is in its transmit mode to the OD 108. Notice that a routine event message which represents a transition from X to 0 or 1 need not be handled by the SA 106. This is because SS 104 continuously updates the value of the gate whenever there is an input change. The last event on a gate output is always transmitted down the pipeline due to the LIFO ordering of the SS event list 402. Thus all these routine events received from the SS are legitimate (uncanceled) events. Finally, the PE_FLAG and X_FLAGS are reset in preparation for receiving new events. For the example of FIG. 2, SA 106 does not schedule an X event because the previous scheduled time is later than the present scheduled time. In SS 104, the 1-0 event at time 12 overwrites the 0-1 transition at time 15. Thus, SS 104 will transmit a 0 state at time 12, which has no effect, and the transmission at time 15 is cancelled. For the example of FIG. 3, the SA 106 generates and sends the event transition from 0 to X on gate 40 at time 15, whereas at time 19 it merely forwards the event corresponding to the transition from X to 0 from the SS 104 directly to the OD 108.

It is to be understood that the above described arrangements are merely illustrative of the application of principles of the invention and that other arrangements may be devised by workers skilled in the art without departing from the spirit and scope of the invention.

---

APPENDIX A SS 104 - SIGNAL SCHEDULING ALGORITHM

```
RECEIVE_event: for (every received_event)
    UPDATE_GATE_RECORD(flag=1,SCH_TIME,
    value);
    SCHEDULE_EVENT_LIST(gate_no,SCH_TIME);
    FORWARD_RCVD_EVENT_TO_SA
end /* for */
Send Switch_to_Transmit_Mode to SA
Send CUR_TIME to SA
TRANSMIT_event: for (every scheduled_event of present
time slot)
    GET_GATE_RECORD(flag,SCH_TIME);
    if ((CUR_TIME != SCH_TIME)|| (!flag))
        CANCEL_EVENT;
    else
        TRANSMIT_EVENT;
    end /* if */
    UPDATE_GATE_RECORD(flag=0);
end /* for */
Send Switch_to_Rcv_Mode to SA
```

---

APPENDIX B SA 106 - SPIKE ANALYSIS ALGORITHM

```
RECEIVE_MODE
    while(recd_msgs)
        RECEIVE(GATE_NO,CUR_TIME,value,SCH_TIME)
        GET_GATE_RECORD(PREV_CURR_TIME,
        PE_FLAG,value, PREV_SCH_TIME)
        UPDATE_GATE_RECORD(SCH_TIME,value,
        CUR_TIME)
        if ((PE_FLAG) && !(X_FLAG) &&
        (PREV_SCH_TIME < SCH_TIME))
            input_signal_interval = CUR_TIME -
            PREV_CURR_TIME
            if (input_signal_interval > weighted_delay)
                SCHEDULE_EVENT(gate_no,prev_sch_time)
                SET_X_FLAG(gate_no)
            end /* if */
        else
            SET_PE_FLAG(gate_no)
        end /* if */
    end /* while */
/* TRANSMIT_to_OD */
    RECEIVE(CUR_TIME) from SS
    for (every scheduled_event in SA at present_time)
        GET_EVENT(gate_no,value) from SA event_list
        TRANSMIT_EVENT(gate_no,X)
    end /* for */
    FORWARD_SS_EVENTS coming in now from
    SS TO OD
    RESET_PE_FLAG(gate_no)
    RESET_X_FLAG(gate_no)
end /* for */ goto RECEIVE_MODE
```

What is claimed is:

1. A logic circuit simulator arranged for detecting spike conditions at the outputs of gates in a simulated logic network, which comprises
    means for generating input messages specifying the scheduled times of output events and resulting new output values for said gates;

first and second time wheels each having a plurality of time slots corresponding to specific times, scheduling means responsive to said input messages for linking the identities and last-received new output values for gates having output events scheduled at a specific time to the time slot in said first time wheel corresponding to such time and for transmitting output messages indicating new output values for the gates linked to each particular time slot in said first time wheel at the time associated with that particular time slot; and analyzing means responsive to said input messages for determining the elapsed time between arrivals of successive input messages for each gate and, if said elapsed time exceeds a reference time for said gate, linking the identity of said gate and the presence of a spike condition with the time slot of said second time wheel corresponding to the start of the spike condition and for transmitting output messages indicating spike conditions for the gates linked to each particular time slot in said second time wheel at the time associated with that particular time slot.

2. The simulator of claim 1 wherein said reference time is a first duration for a falling output value and a second duration for a rising output value.

3. The simulator of claim 1 wherein said reference time can be weighted by a variable.

4. The simulator of claim 1 wherein said analyzing means includes means for using the scheduled time for the next-to-last output event for said gate as the start of the spike condition.

5. The simulator of claim 1 wherein said first time wheel and said scheduling means are a first programmable processor and said second time wheel and said analyzing means are a second programmable processor, said first and second programmable processors being programmed to perform their respective portions of the overall circuit simulation.

6. The simulator of claim 5 wherein said means for generating input messages, said first programmable processor and said second programmable processor are arranged in a series-connected pipeline.

7. A method of detecting spike conditions at the outputs of gates in a simulated logic network, which comprises the steps of generating input messages specifying the scheduled times of output events and resulting new output values for said gates;

maintaining first and second time wheels, each time wheel having a plurality of time slots corresponding to specific times;

responsive to said input messages, linking the identities and last-received new output values of gates having output events scheduled at a specific time with the time slot of said first time wheel corresponding to such time;

at the time associated with each time slot in said first time wheel, transmitting output messages indicating the new output values for the gates linked to such time slot;

analyzing said input messages by determining the elapsed time between arrivals of successive input messages for each gate and, if said elapsed time exceeds a reference time for said gate, linking the identity of said gate and the presence of a spike condition with the time slot of said second time wheel corresponding to the start of said spike condition; and at the time associated with each time slot in said second time wheel, transmitting output messages indicating spike conditions for the gates linked to such time slot.

8. The method of claim 7 wherein the reference time is weighted by a variable.

9. The method of claim 7 wherein said reference time is a first duration for a falling output value and a second duration for a rising output value.

10. The method of claim 7 wherein said analyzing step further comprises linking the identity of said gate and the presence of a spike condition with the time slot of said second time wheel corresponding to the scheduled time for the next-to-last-received output event for said gate.

* * * * *